US005846861A

United States Patent [19]

Saitoh

[11] Patent Number: 5,846,861

[45] Date of Patent: Dec. 8, 1998

[54] METHOD OF MANUFACTURING NON-VOLATILE SEMICONDUCTOR MEMORY HAVING ERASING GATE

[75] Inventor: Kenji Saitoh, Tokyo, Japan

[73] Assignee: NEC Corporation, Tokyo, Japan

[21] Appl. No.: 740,507

[22] Filed: Oct. 30, 1996

[30] Foreign Application Priority Data

Oct. 31, 1995 [JP] Japan .................................... 7-308356

[51] Int. Cl.[6] .................................................. H01L 21/336

[52] U.S. Cl. ............................................ 438/258; 438/264

[58] Field of Search .................................... 438/258, 264, 438/265, 266, 593, 594, 738

[56] References Cited

U.S. PATENT DOCUMENTS

| | | | |
|---|---|---|---|
| 5,070,032 | 12/1991 | Yuan | 438/267 |
| 5,268,319 | 12/1993 | Harari | 438/260 |

FOREIGN PATENT DOCUMENTS

| | | |
|---|---|---|
| 2-292870 | 12/1990 | Japan . |

OTHER PUBLICATIONS

IBM Technical Disclosure Bulletin, vol. 32, No. 4A, Sep. 1989, pp. 155–158, "Dielectric Spacer Formation to Eliminate Polysilicon Stringers".

*Primary Examiner*—John Niebling
*Assistant Examiner*—Michael S. Lebertritt
*Attorney, Agent, or Firm*—Sughrue, Mion, Zinn, Macpeak & Seal, PLLC

[57] ABSTRACT

In a method of manufacturing non-volatile semi-conductor memory including a memory cell transistor and a peripheral transistor, a floating gate and a control gate of the memory cell transistor is formed on a semiconductor substrate and a gate electrode of the peripheral transistor is formed on the semiconductor substrate. The control gate and gate electrode are covered with first and second insulating layers, respectively. A conductive layer is deposited to cover the first and second insulating layers. The conductive layer is etched back until the first and second insulating layers are exposed. An erasing gate of the memory cell transistor is formed by leaving the conductive layer on the insulating layer. A first mask layer on the second insulating layer and a second mask layer on the erasing gate is formed. The conductive layer remaining in the regions outside the masks is removed.

5 Claims, 11 Drawing Sheets

METHOD OF MANUFACTURING NON-VOLATILE SEMICONDUCTOR MEMORY HAVING ERASING GATE

BACKGROUND OF THE INVENTION

The present invention relates to a method of manufacturing a semiconductor memory device and, more particularly, to manufacturing method for an electrically erasable and programmable read only memory device (EEPROM) in which a cell transistor has an erasing gate in addition to a floating gate and a control gate.

It is well known in general that each memory cell transistor of an EEPROM has a floating gate and a control gate. The threshold voltage of the transistor is controlled by the amount of electrical charge retained in the floating gate.

In recent years, such an EEPROM that is equipped with an erasing gate in addition to the control gate and the floating gate has been developed. Such an EEPROM is disclosed in Japanese Laid-Open Patent Publication SHO 2-292870. In this memory, one erasing gate is formed in a shared manner in the vicinity of respective floating gates of a plurality of memory cells that are placed adjacently to each other. The erasing gate is formed on one part of the floating gate with intervention of a dielectric film representing a tunneling effect (i.e., a tunneling insulating film).

It is possible for the EEPROM equipped with an erase gate to remove the electric charge in the floating gate easily and quickly. Since the voltage of the erasing gate can be lower, it is possible to prolong the life of the device.

In the following, a method of manufacturing such a non-volatile semiconductor memory will be described with reference to FIGS. 1A–1I.

Referring to FIG. 1A, a first silicon oxide film 201 which is to become a field oxide film is formed on the surface of a P-type silicon substrate 101 by LOCOS method or CVD method, and a memory cell region 1 and a peripheral circuit region 2 are partitioned.

Then, referring to FIG. 1B a part of the first silicon oxide film 201 is removed and a second silicon oxide film 202 which is to become a gate oxide film is grown to a thickness of 20 nm by a thermal oxidation method. Subsequently, a first polysilicon film 301 which is to become a floating gate is grown on the first silicon oxide film 201 and the second silicon oxide film 202 to a thickness of about 300 nm. After that, through a lithography process, the system is subjected to an etching to leave the first polysilicon film 301 only in the memory cell region 1. Further, by subjecting the first polysilicon film 301 to a thermal oxidation at 900° C. or more, or CVD method or the combination of the two, a third silicon oxide film 203 is formed on the first polysilicon 301 to a thickness of 200 nm.

Following the above, referring to FIG. 1C, a second polysilicon film 302 which is to become a control gate and a gate is grown on the entire surface to a thickness of about 300 nm.

The resistivity of the control gate and the gate of the peripheral circuit region 2 are both 20 Ω/□. Therefore, both can be made using the same process, since they are injected with the same amount of ions. On the other hand, the resistivity of the floating gate is 1 kΩ/□.

Subsequently, referring to FIG. 1D, a fourth silicon oxide film 204 is deposited on the entire surface to a thickness of about 300 nm, and through a lithography process the fourth silicon oxide film 204 and the second polysilicon film 302 are etched consecutively to leave them at specified regions so as to make them serve as a control gate of a memory cell transistor of the memory cell region and a gate electrode of a transistor of a peripheral circuit region. Next, after depositing a fifth silicon oxide film 205 with thickness of about 100 nm on the entire surface, the system is subjected to an etching corresponding to the thickness of the fifth silicon oxide film 205 to form sidewalls of the control gate in the memory cell region 1 and the gate of the transistor in the peripheral circuit region 2. The sidewalls of the gate of the transistor in the peripheral circuit region 2 are formed to a lightly doped drain (LDD) structure. The sidewalls of the control gate in the memory cell region 1 are necessary to separate electrically to an erase gate as follows. In this process, the exposed portions of the third silicon oxide film 203 are also removed simultaneously.

Subsequently, referring to FIG. 1E, through a lithography process, the peripheral circuit region 2 is covered with a resist 403, and the first polysilicon film 301 is subjected to an etching.

Then, referring to FIG. 1F, a sixth silicon oxide film 206 which is to become an erasing gate oxide film is formed on the side faces of the first polysilicon film 301 by subjecting to a thermal oxidation at 900° C. or more or to CVD.

Next, referring to FIG. 1G, A third polysilicon film 303 is grown to a thickness of about 300 nm, and it is converted to N-type polysilicon by introducing phosphorus which will become an impurity.

Thereupon, referring to FIG. 1H, through a lithography process, a resist 404 is left so as to cover the central part of each memory cell region, and an erasing gate is formed directly below the resist 404 by selectively etching the third polysilicon film 303 using the resist 404 as a mask. In this case, the third polysilicon film existing in the peripheral circuit region 2 and in the space between the adjacent memory cell are removed completely. After that, an N-type and a P-type impurities are introduced to specified regions by ion implantation in order to form diffused layers which are to become the source and the drain of the transistor in the peripheral circuit region 2.

Subsequently, referring to FIG. 1I, an insulating film which is to become a layer insulating film 104 is formed. Although not shown in the figure, the layer insulating film 104 is provided with contact holes, in order to establish electrical connection with the P-type silicon substrate 101 and the second and third polysilicon films 302 and 303, as well as wiring layers. In this way manufacture of an EEPROM flash memory is completed.

However, with the method shown in FIG. 1G it is necessary, at the time of forming an erasing gate by etching the third polysilicon film 303, to give an overetching of about 100–200% corresponding to the film thickness of the third polysilicon film 303 for the complete removal of the third polysilicon film 303 in the space which is not involved in the formation of the erasing gate, because of the large underlying level difference in the space between the memory cells (level difference indicated the Symbol Z1 and Z2). If this overetching is insufficient, the third polysilicon film 303 is left on the sidewall parts of the memory cell as indicated by the symbol X in FIG. 2A, which short-circuits the adjacent erasing gate at end of erasing gate in FIG. 2B, resulting in a problem of degrading the yield of the semiconductor memory.

On the other hand, if the overetching is excessive, the second silicon oxide film 202 which is to become a gate oxide film of a transistor in the peripheral circuit region 2 is etched, as shown by the symbol Y in the FIG. 2A, giving damage to the diffused layer formed directly below, and leads to the failure of the elements in the peripheral circuit region 2 and a reduction in the production yield. Therefore, a highly precise management is required for the necessary and sufficient etching of the third polysilicon film 303. In reality, however, it is difficult to provide such a control and it has been an obstacle to the improvement of the production yield.

SUMMARY OF THE INVENTION

It is therefore an object of the present invention to provide an improved method of manufacturing an EEPROM having an erasing gate.

Another object of the present invention is to provide a method of producing a semiconductor memory which makes it possible to prevent inconveniences accompanying underetching or overetching without a highly precise management of etching in forming the erasing gate, and to improve the production yield.

A method of manufacturing a semiconductor memory device including a memory cell transistor and a peripheral transistor comprises the steps of forming a floating gate and a control gate of the memory cell transistor on a first region of a semiconductor substrate; covering the floating gate and the control gate with a first insulating layer, the first insulating layer having a first portion which is formed on one part of a peripheral portion of the floating gate and serves as a tunneling insulating film, a second portion which is formed on a remaining part of the peripheral portion of the floating gate, and a third portion which is formed on a top surface of the control gate; forming a gate electrode of the peripheral transistor on a second region of the semiconductor substrate separate from said first region; covering the gate electrode with a second insulating layer; depositing a conductive layer to cover the first and second insulating layers; etching back the conductive layer until the third portion of the first insulating film and the second insulating layer are exposed, a first part of the conductive layer being thereby left on the first portion of the first insulating layer to serve as an erasing gate of the memory cell transistor and a second part of the conductive layer being left on the second portion of the first insulating layer; forming a first mask layer on the second insulating layer to protect the peripheral transistor and a second mask layer on the first part of the conductive layer to protect the erasing gate; and removing the second part of the conductive layer by use of the first and second mask layers as a mask.

BRIEF DESCRIPTION OF THE DRAWING

The above and other objects, advantages and features of the present invention will be more apparent from the following description taken in conjunction with the accompanying drawing, in which.

DETAILED DESCRIPTION OF THE PREFERRED EMBODIMENTS

Figure 1A:
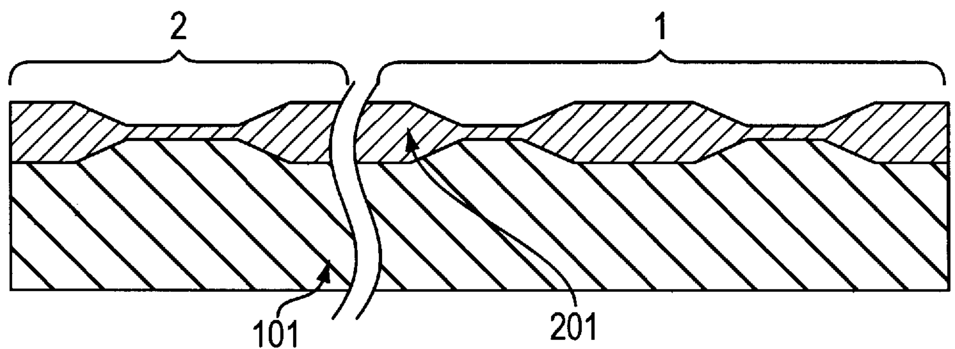
FIGS. 1A–1I are cross sectional views showing processing steps according to a method of the related art.
Figure 1B:
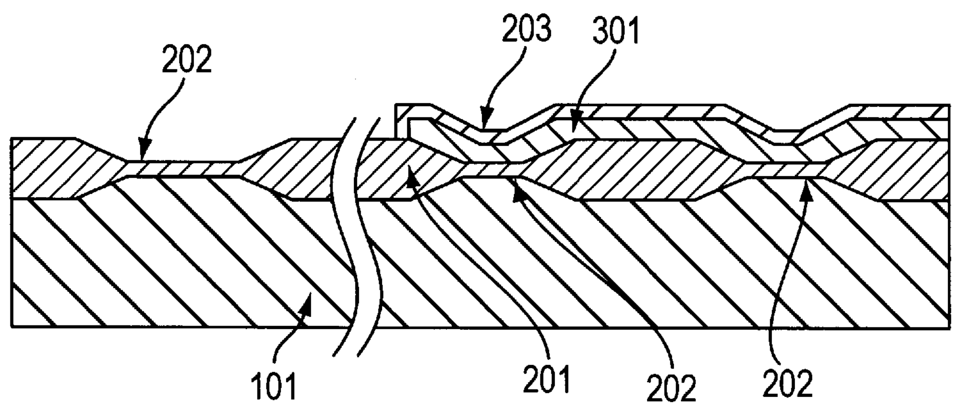
Figure 1C:
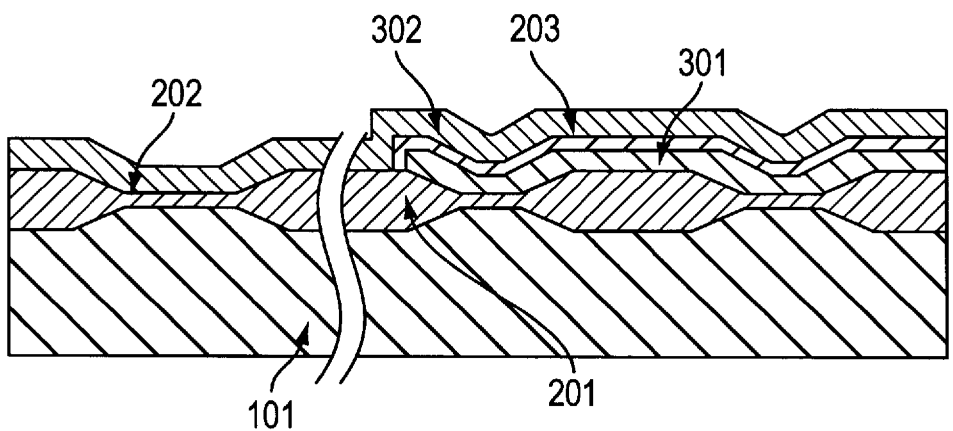
Figure 1D:
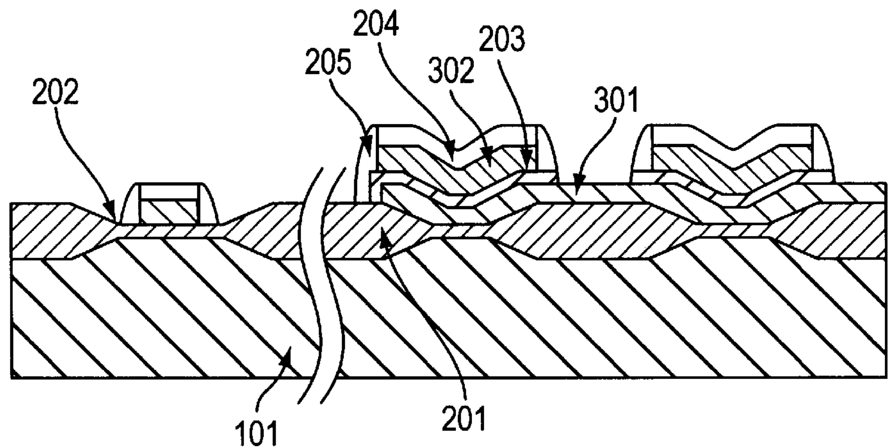
Figure 1E:
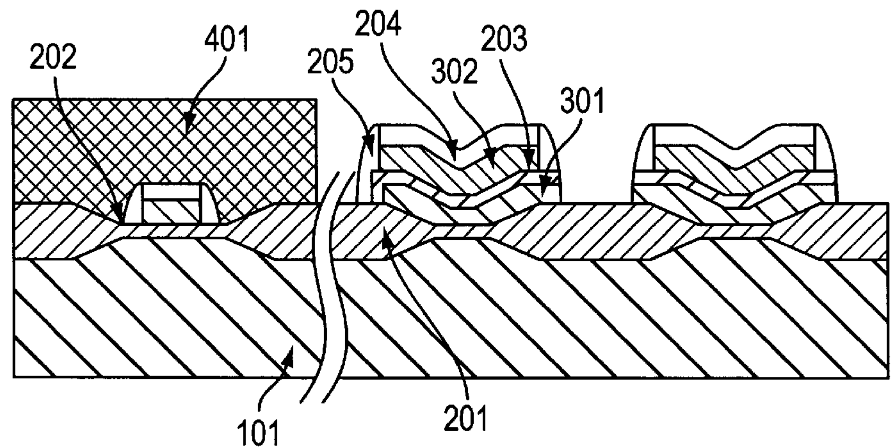
Figure 1F:
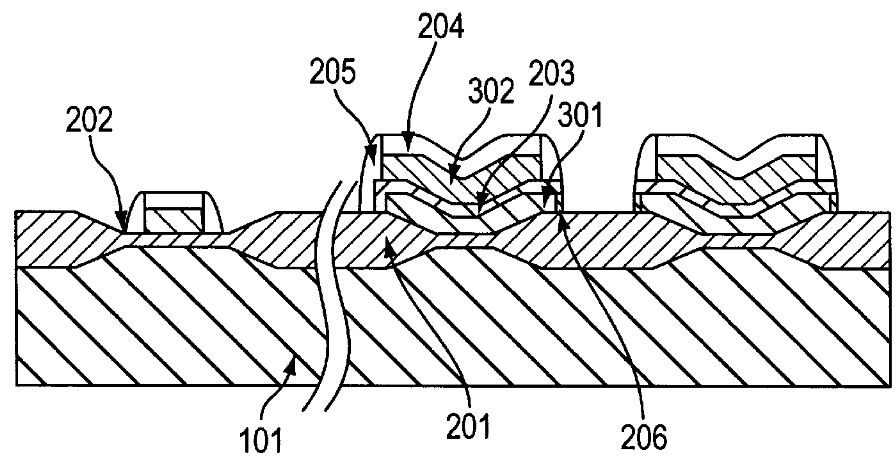
Figure 1G:
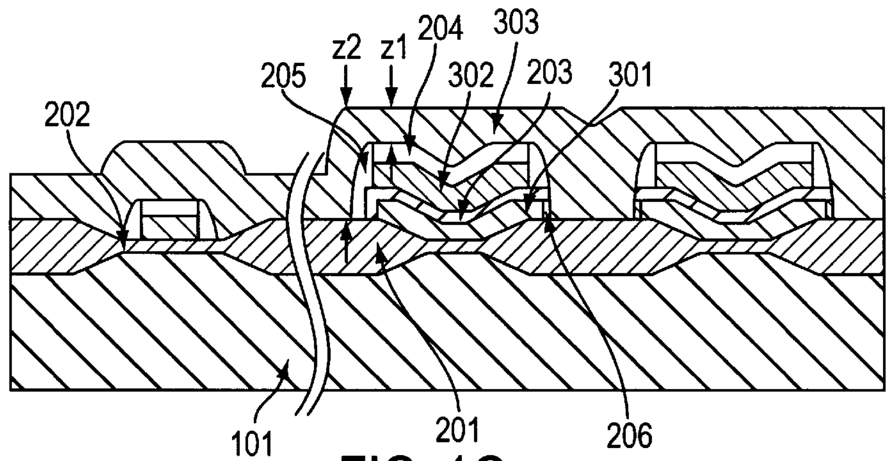
Figure 1H:
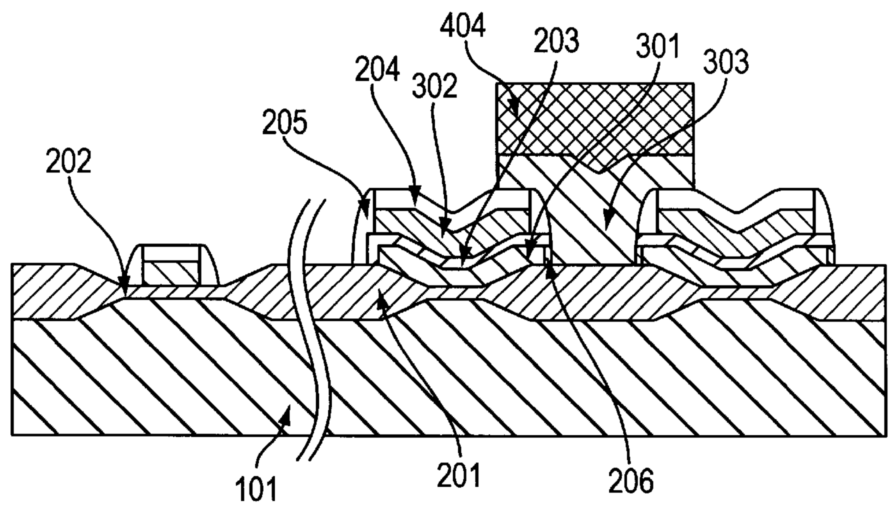
Figure 1I:
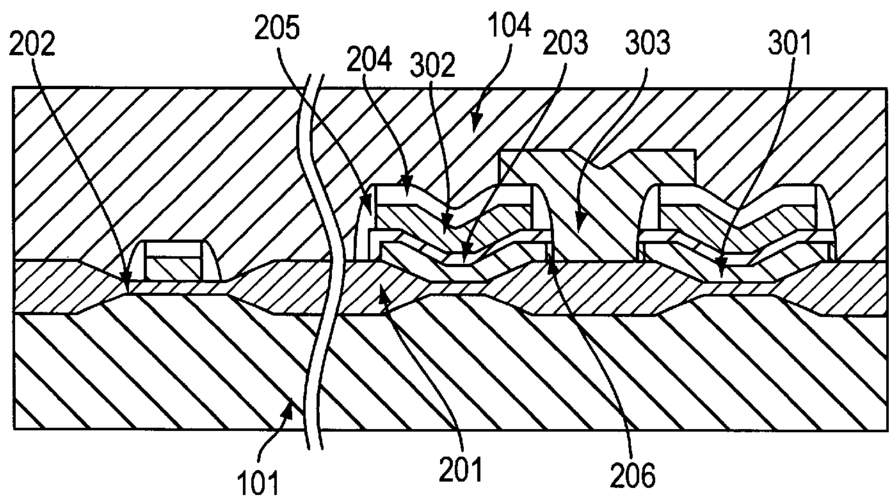
Figure 2A:
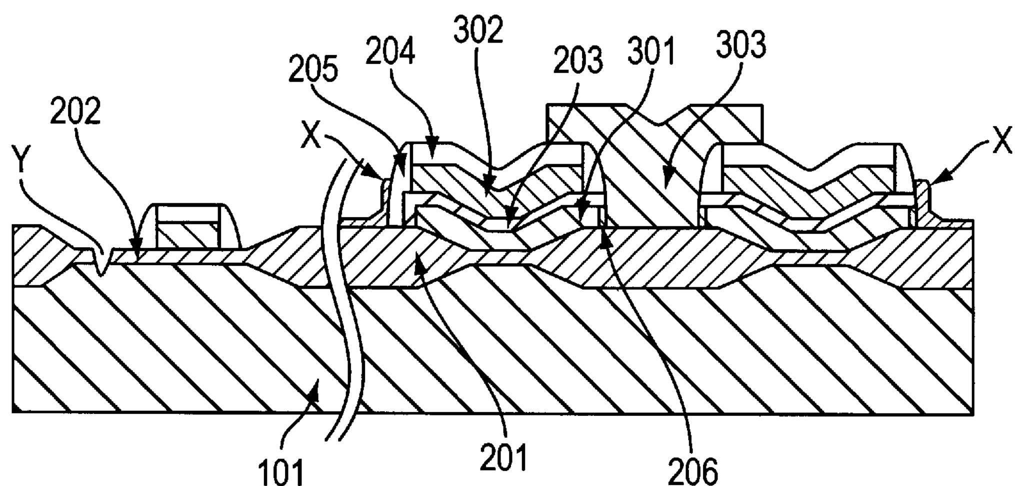
FIG. 2A is a cross sectional view showing processing steps according to a method of the related art and FIG. 2B is a plane view illustrative shown in FIG. 2A.
Figure 2B:
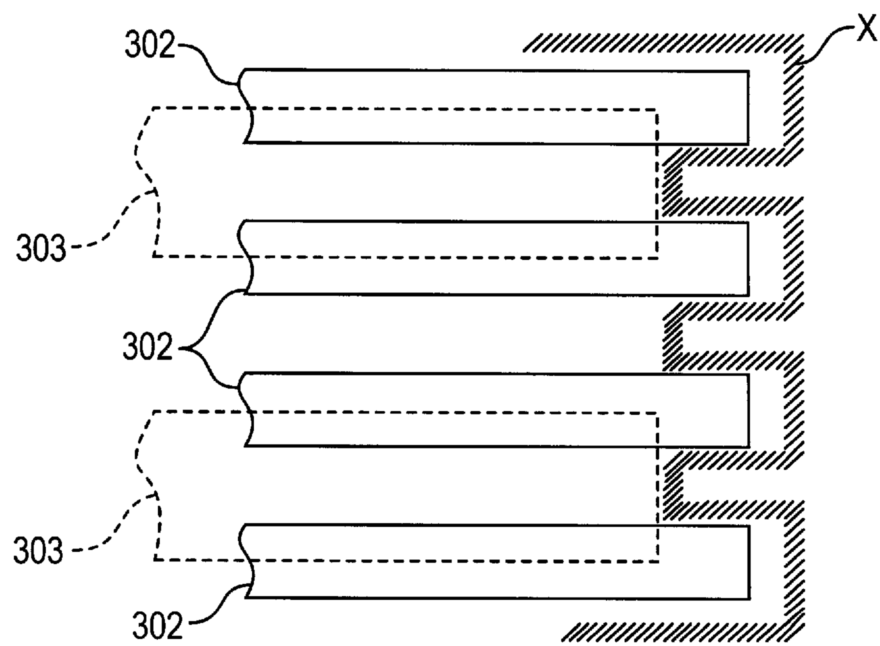
Figure 3:
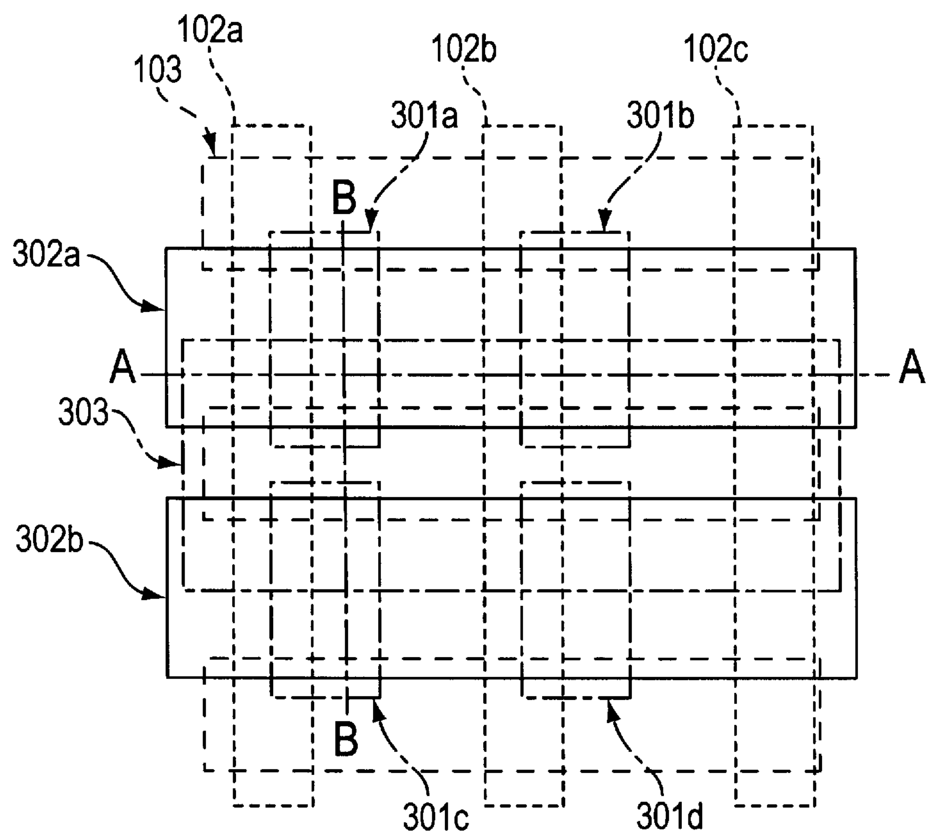
FIG. 3 is a plane view illustrative of memory cell region of the semiconductor memory.
Figure 4:
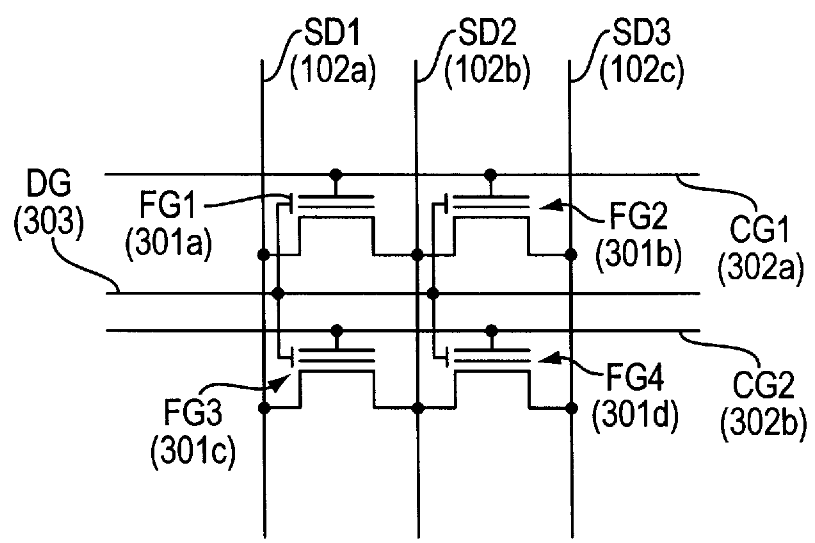
FIG. 4 is an equivalent circuit schematic of the cell shown in FIG. 3.

FIG. 3 is a plan view illustrative of 4 memory cell transistors of a memory cell region. The surface of the semiconductor substrate is separated by a plurality of field oxides 103 formed in parallel to each other. A plurality of diffusion regions 102*a* to 102*c* are formed in the semiconductor substrate in a direction perpendicular to the field oxide film 103. The diffusion regions 102*a,* 102*b,* and 102*c* correspond to the respective source/drain line SD1, SD2, and SD3 of memory transistors shown in FIG. 4. A first polysilicon film 301 is formed in a region divided by the field oxide 103 and the diffusion region 102 over the substrate and so as to cross one side of the diffusion region 102 in a plane view. The first polysilicon film 301 and the diffusion region 102 are isolated electrically by a dielectric film 202. The first polysilicon film 301 corresponds to the floating gate FG of a memory cell transistor shown in FIG. 4. A second polysilicon film 302 is formed between the field oxides 103 adjacently to each other in parallel with the plurality of the field oxides 103. The second polysilicon film 302 is isolated electrically from the first polysilicon film 301 by a dielectric film 206. The second polysilicon film 302 corresponds to the control gate CG of a memory cell transistor shown in FIG. 4. A third polysilicon film 303 is formed between the second polysilicon films 302 adjacently to each other in parallel with the plurally of second polysilicon films 302. The third polysilicon film 303 is isolated electrically from the second polysilicon film 302 by a dielectric film 203. The third polysilicon film 302 corresponds to the erase gate DG of a memory cell transistor shown in FIG. 4.

Figure 5A:
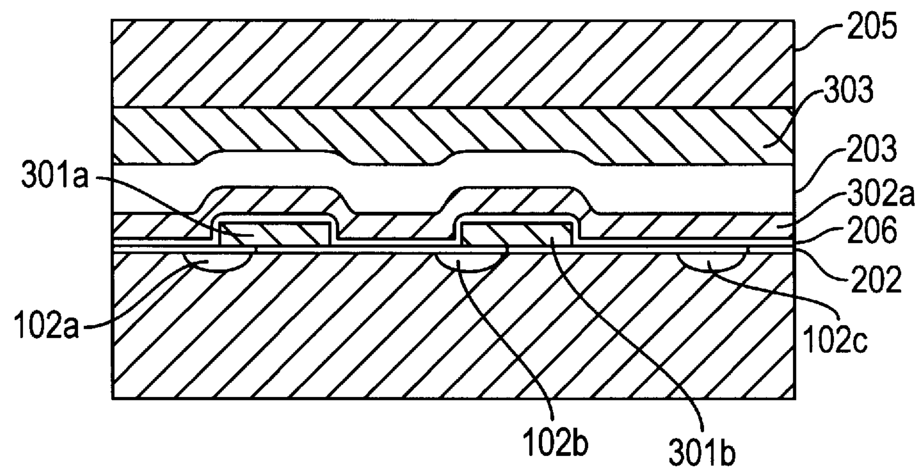
FIGS. 5A, 5B are cross sectional views taken a line A—A, a line B—B, respectively shown in FIG. 3.
Figure 5B:
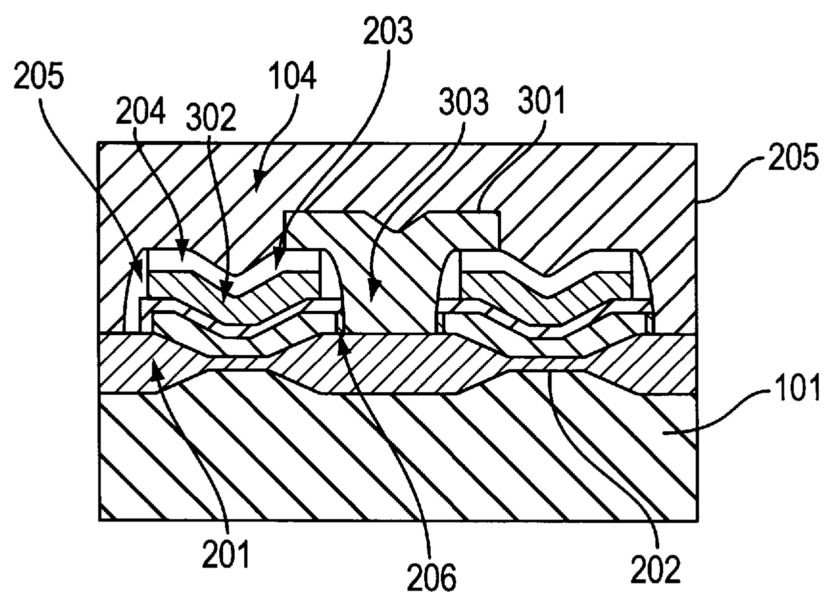

Referring to FIGS. 5*a* and 5*b,* the non-volatile semiconductor memory is formed from the memory cell transistor of a memory cell region and the transistors of a peripheral circuit region at the same time. The peripheral circuit region is separated from memory cell region by a space and forms for example, address buffer, X decoder.

Figure 6A:
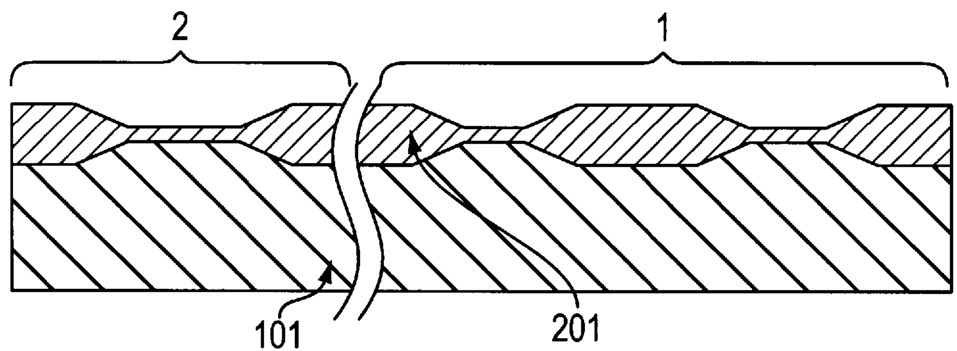
FIGS. 6A–6J are cross sectional views showing the processing steps according to a method of a first embodiment of the present invention.

Referring to FIG. 6A, by selectively implanting arsenic into a P-type silicon substrate 101 by ion implantation, a region of an embedded diffused layer 102 shown in FIG. 1 is converted to an N-type diffused layer region. Then, a first silicon oxide film 201 which is to become a field oxide film 103 is formed by LOCOS method or CVD method, and a memory cell region 1 and a peripheral circuit region 2 are partitioned.

Figure 6B:
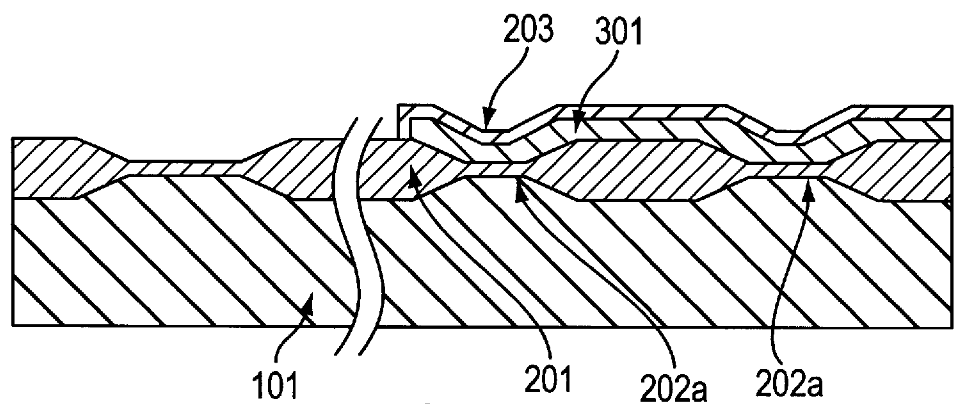

Next, referring to FIG. 6B, the first silicon oxide film 201 is selectively removed, and in its place, a second silicon oxide film 202*a* which is to become a gate oxide film is formed to a thickness of 20 nm by thermal oxidation method. Then, A first polysilicon film 301 which is to become a floating gate is formed to a thickness of about 300 nm on the first silicon oxide film 201 and the second silicon oxide film 202, and the first polysilicon film 301 is etched through a lithography process so as to leave it only in the memory cell region 1. Subsequently, a third silicon oxide film 203 is formed to a thickness of 200 nm on the first polysilicon film 301 by a thermal oxidation of the first polysilicon film 301 at 900° C. or more, or CVD or the combination of the two.

Figure 6C:
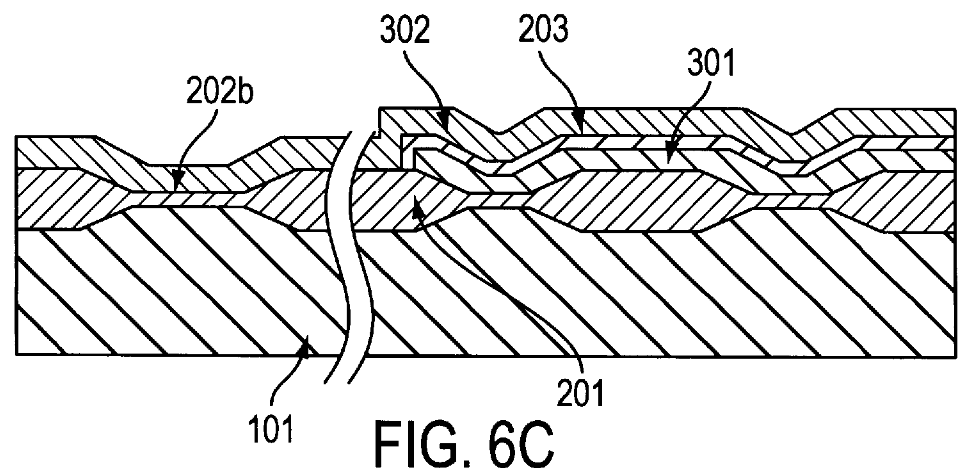

Following that, referring to FIG. 6C, the first silicon oxide film 201 is selectively removed and in its place a silicon oxide film 202*b* is formed to a thickness of 20 nm by thermal oxidation method. A second polysilicon film 302 which is to become a control gate is grown to a thickness of about 300 nm.

Figure 6D:
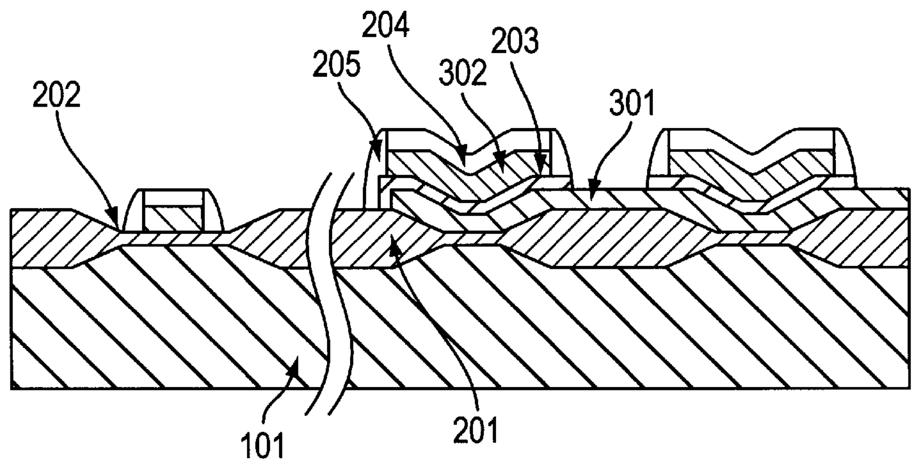

Then, referring to FIG. 6D, a fourth silicon oxide film 204 is deposited on the entire surface to a thickness of about 300 nm, and the fourth silicon oxide film 204 and the second polysilicon film 302 are etched consecutively by lithography to leave them in specified regions so as to form a control gate of the memory cell region 1 and a gate electrode of a transistor of the peripheral circuit region 2. Next, after forming on the entire surface a fifth silicon oxide film 205 with thickness of about 100 nm, sidewalls of silicon oxide film are formed for the control gate in the memory cell region 1 and the transistor gate in the peripheral circuit region 2 by conducting an anisotropic etching corresponding to the film thickness of the fifth silicon oxide film 205. At this time, the exposed portions of the third silicon oxide film 203 are also removed simultaneously.

Figure 6E:
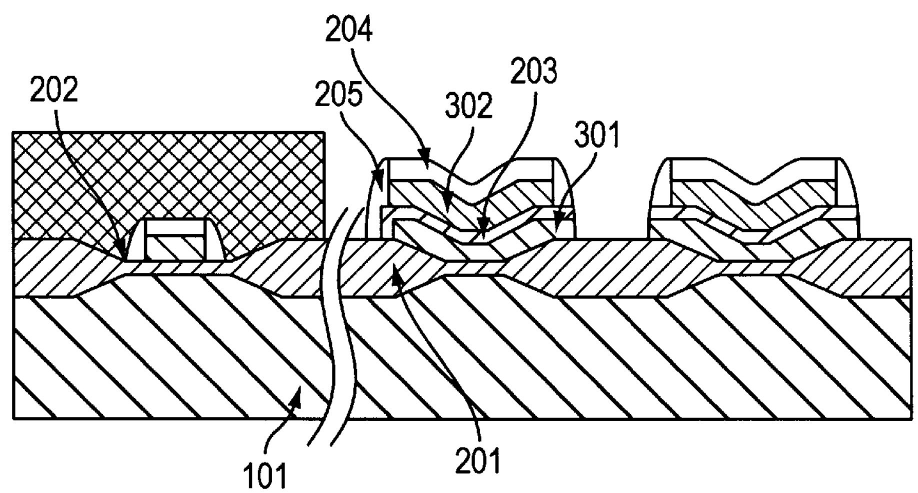

Subsequently, referring to FIG. 6E, through a lithography process, the peripheral circuit region 2 is covered with a resist 401, and the first polysilicon film 301 is etched.

Figure 6F:
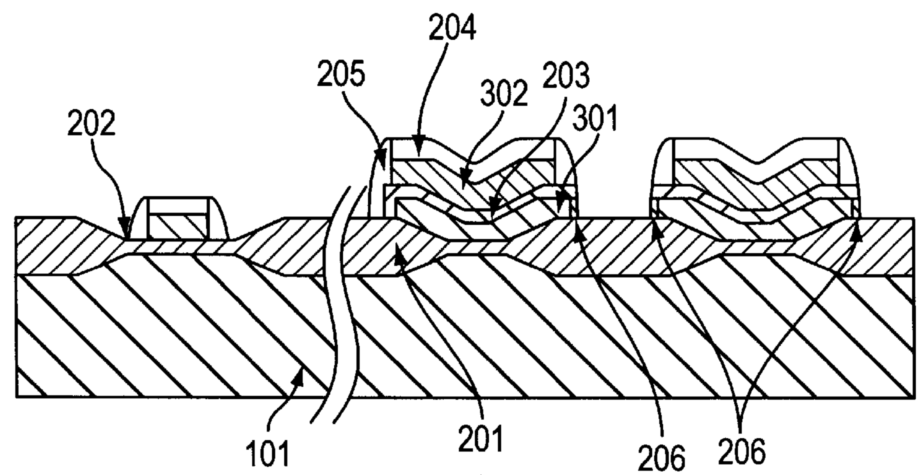

Then, referring to FIG. 6F, by subjecting the side faces of the first polysilicon film 301 exposed by the etching to a thermal oxidation at 900° C. or more or by CVD, a sixth silicon oxide film 206 which is to become an erasing gate oxide film is formed on the side faces of the first polysilicon film 301.

Figure 6G:
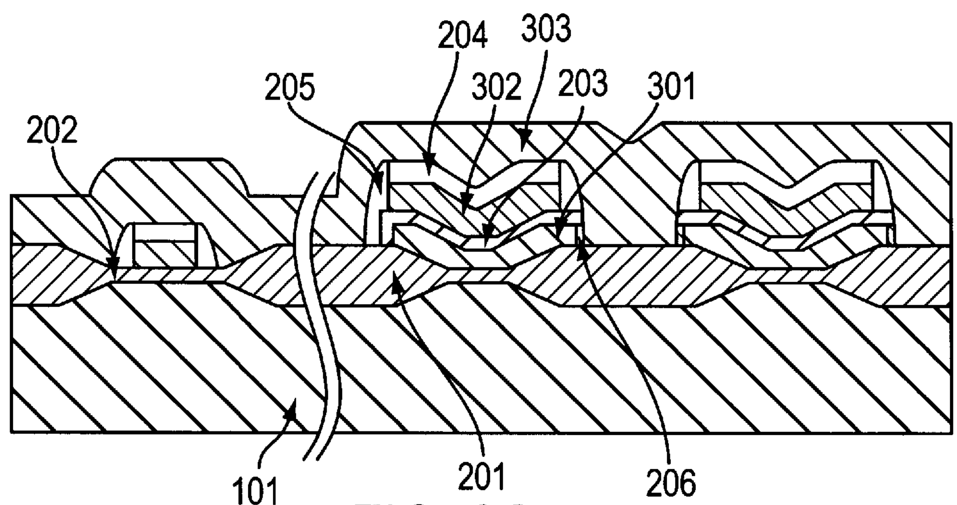

Next, as in FIG. 6G, A third polysilicon film 303 is grown to a thickness of about 300 nm, and it is converted to N-type polysilicon by introducing phosphorus which is an impurity.

Figure 6H:
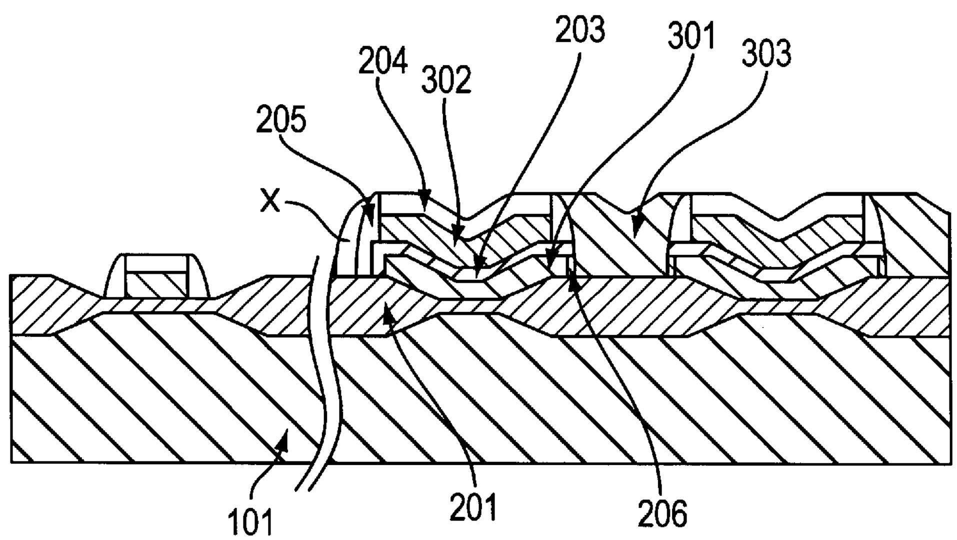

Following that, referring to FIG. 6H, the third polysilicon film 303 is etched back by anisotropic etching. Then the etching stops before the gate film of the transistor of the peripheral circuit region 2 is etched. As a result, the third polysilicon film 303 is left only in the step part X between the memory cell region 1 and the peripheral circuit 2 and the narrow space between the memory cells of memory cell region 1.

Figure 6I:
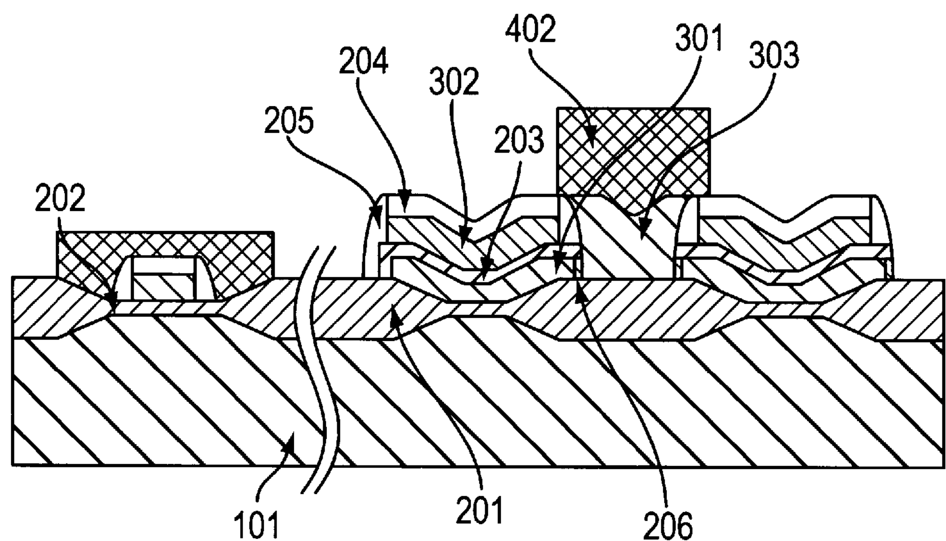

Next, referring to FIG. 6I, a resist 402 is patterned by lithography so as to cover the formation region of the erasing gate in every other space of the memory cells and the formation region of a diffused layer in the peripheral circuit region 2. Then, the third polysilicon film 303 at the step part X and in the space between memory cells where erase gate is not formed, are removed completely by etching using the resist 402 as a mask.

Figure 6J:
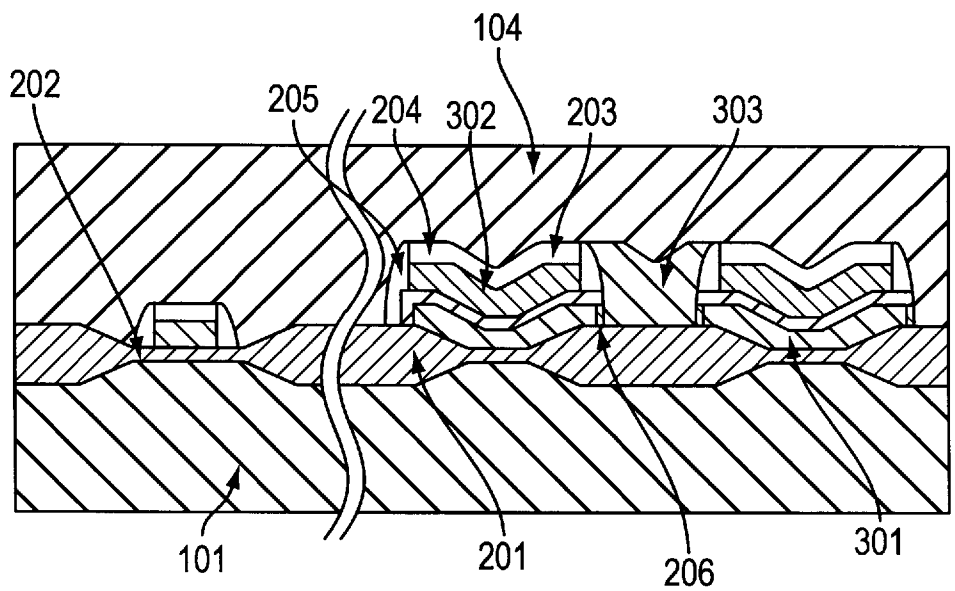

Following that, an N-type and a P-type impurities are introduced to specified regions by ion implantation to form diffused layers for the source and drain of a transistor in the peripheral circuit region 2. Then, referring to FIG. 6J, an insulating film 104 is formed, contact holes, not shown, are formed in the layer insulating film 104 in order to establish electrical connection with the P-type silicon substrate 101 and the second and third polysilicon films 302 and 303, and wiring layers are formed, completing an EEPROM flash memory.

Therefore, according to the above-mentioned, in the etching of the third polysilicon film 303 that constitutes the erasing gate, the third polysilicon film 303 is first etched by the amount corresponding to its thickness of deposition. Hence, it is possible to remove the third polysilicon film 303 almost completely from regions with small level difference such as the peripheral circuit region, especially the formation region of diffused layers of the transistor. In this case, with an overetching of about 10% it is possible to make the etching more complete. On the other hand, No damage will be given to the diffused layers or the like by an overetching of this order. With this as a preparation, an etching is carried out once again by covering the formation region of the erasing gate and the regions of diffused layers with a resist 402, and the third polysilicon film 303 left unremoved by the previous etching, especially in such regions as the step part of the memory cell, is removed completely. In this case, the diffused layers will not be damaged by the etching since they are covered with the resist. In this way, it is possible to prevent the electrical short-circuiting owing to the third polysilicon film 303 left in the step part and the damages to the diffused layers of the transistor, and improve the production yield.

Figure 7A:
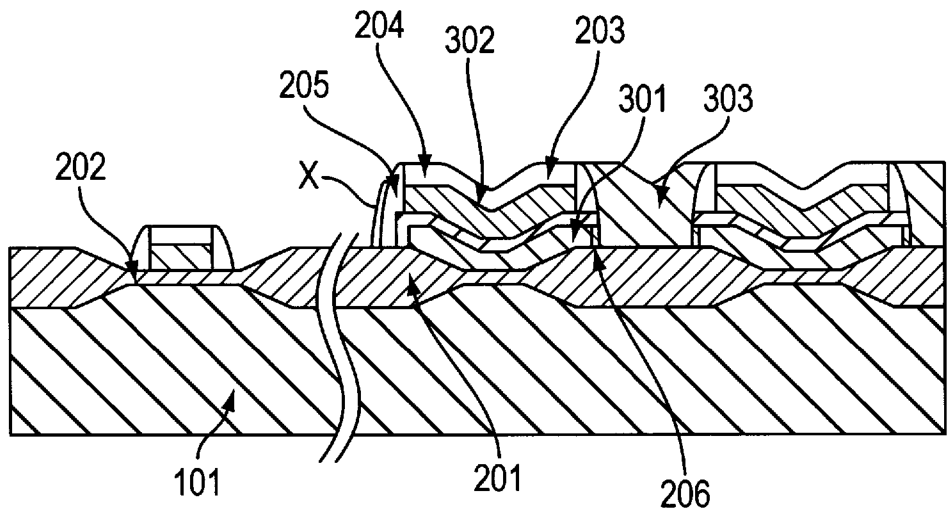
FIGS. 7A–7B are cross sectional views showing the processing steps according to a method of a second embodiment of the present invention.
Figure 7B:
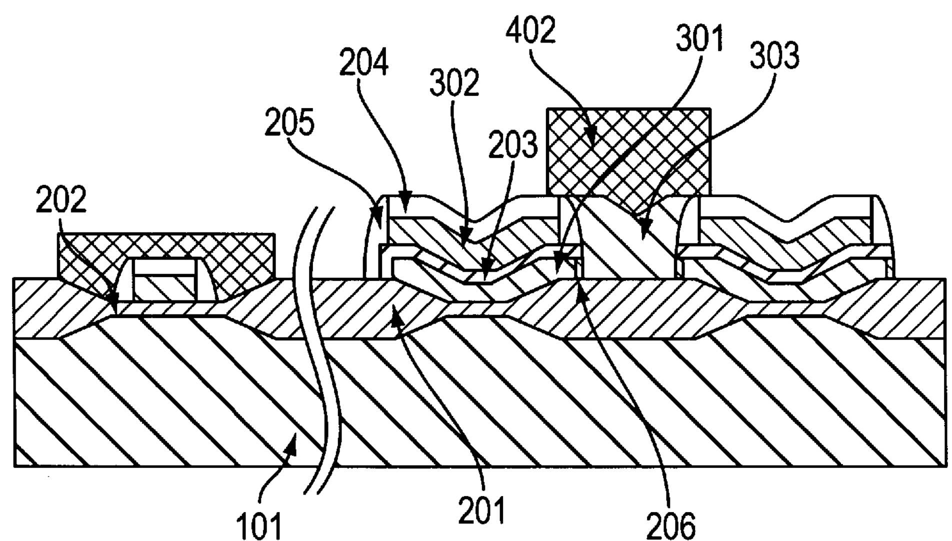

FIGS. 7A–7B are cross sectional views of a second embodiment of the present invention. In the second embodiment mode, the processes up to that in FIG. 6G are the same as in the second embodiment mode so that illustration and description for them will be omitted. Following these processes, an isotropic etching is carried out to eliminate the third polysilicon film 303 from the step part, as in FIG. 7A. As a result, the third polysilicon film 303 is left only as narrow spaces (symbol X').

Next, as in FIG. 7B, through a lithography process, a resist 402 is patterned so as to cover the formation region of the erasing gate for each memory cell and the diffused layers in the peripheral circuit region 2, and etching is carried out with the resist 402 as a mask, to remove completely the third polysilicon film 303 remaining in the step part and in the space between the memory cells where the erasing gate is not formed. Subsequent processes are the same as those following FIG. 6J; and thus an EEPROM flash memory is completed In the second embodiment mode, the third polysilicon film 303 is isotropically etched so that the third polysilicon film 303 on the step part X' is effectively etched reducing the amount of residual polysilicon, which contributes to the reduction of the time of the subsequent etching.

According to the first embodiment of the present invention, after depositing the third polysilicon film to be used for forming the erasing gate, the third polysilicon film is etched back to leave it in the region including the formation region of the erasing gate, then the formation region of the erasing gate and the regions of diffused layers of the transistor are masked with a resist, and the third polysilicon film in the regions outside the mask is removed by etching. Therefore, even if the amount of overetching of the third polysilicon film is reduced, it is possible to prevent insufficient etching of the step part and reduction of the production yield caused by the electrical short-circuiting in the erasing gate, as well as damages to the diffused layers in the peripheral circuit region due to etching, thereby preventing the reduction of the production yield due to deterioration in element characteristics, and this invention has the effect of improving the overall production yield.

According to the second embodiment of the present invention, the method can reduce the time of the etching.

It is apparent that the present invention is not limited to the above embodiments but may be modified and changed without departing from the scope and spirit of the invention.

What is claimed is:

1. A method of manufacturing a semiconductor memory device including a memory cell transistor and a peripheral transistor, comprising the steps of:

forming a floating gate and a control gate of said memory cell transistor on a first region of a semiconductor substrate;

covering said floating gate and said control gate with a first insulating layer, said first insulating layer having a first portion which is formed on one part of a peripheral portion of said floating gate and serves as a tunneling insulating film, a second portion which is formed on a remaining part of said peripheral portion of said floating gate, and a third portion which is formed on a top surface of said control gate;

forming a gate electrode of said peripheral transistor on a second region of said semiconductor substrate separate from said first region;

covering said gate electrode with a second insulating layer;

depositing a conductive layer to cover said first and second insulating layers;

etching back said conductive layer until said third portion of said first insulating film and said second insulating layer are exposed, a first part of said conductive layer being thereby left on said first portion of said first insulating layer to serve as an erasing gate of said memory cell transistor and a second part of said conductive layer being left on said second portion of said first insulating layer;

forming a first mask layer on said second insulating layer to protect said peripheral transistor and a second mask layer on said first part of said conductive layer to protect said erasing gate; and removing said second part of said conductive layer by use of said first and second mask layers as a mask.

2. A method of a semiconductor memory device comprising the steps of:

selectively forming a first conductive layer on a first insulating layer covering a semiconductor substrate;

covering said first conductive layer with a second insulating layer;

forming first and second control gates on said second insulating layer separately from each other;

covering said first and second control gates with third and fourth insulating layers, respectively;

selectively removing said first conductive layer by use of said third and fourth insulating layers as a mask to form first and second floating gates, each of said first and second floating gates thereby having an exposed side surface;

forming first and second tunnel insulating films on the exposed side surfaces of said first and second floating gates, respectively;

forming a second conductive layer to cover said first to fourth insulating layers and to fill a space between said first and second tunnel insulating films;

etching back said second conductive layer until top surfaces of said third and fourth insulating layers are exposed, a first part of said second conductive layer being thereby left in contact with said first and second tunnel insulating films to serve as a erasing gate and a second part of said second conductive layer being left in contact with said second insulating film covering said erasing gate with a mask layer; and removing said second part of said second conductive layer by use of said mask layer as a mask.

3. The method as claimed in claim 2, further comprising the steps of selectively forming on said semiconductor substrate a gate insulating film of a peripheral transistor, forming a third conductive layer on said second insulating layer and said gate insulating layer, and selectively removing said third conductive layer to form said first and second control gates and a gate electrode of said peripheral transistor, said peripheral transistor being protected by additional mask layer when said step of removing said second part of said second conductive layer is performed.

4. A method of manufacturing a non-volatile semiconductor memory, comprising the steps of;

forming a floating gate on a first region of a semiconductor substrate having said first region and a second region, forming a dielectric film on said floating gate, forming a first conductive film on the entire surface of said first region and said second region, selectively etching said first conductive film thereby to form a gate of a transistor over said second region and a control gate over said dielectric film, forming said walls on both sides of said control gate, forming a tunnel dielectric film adjacent to said floating gate, forming a second conductive film on the entire surface of said first region and said second region, etching back said second conductive film by an amount almost equal to the thickness of said second conductive film to remove said second conductive film from said second region and make an erasing gate adjacent to said tunnel dielectric film, covering said erasing gate and said transistor with a mask, and removing said second conductive film remaining in the regions outside said mask.

5. The method as claimed in claim 4, wherein said second conductive film is etched back by an isotropic etching method.

* * * * *